US012707969B2

(12) United States Patent
Yeh et al.

(10) Patent No.: US 12,707,969 B2
(45) Date of Patent: Aug. 11, 2026

(54) MANUFACTURING METHOD OF SEMICONDUCTOR PACKAGE INCLUDING CUTTING HEAT DISSIPATION SHEET INTO A PLURALITY OF HEAT DISSIPATION FILMS

(71) Applicant: Taiwan Semiconductor Manufacturing Company, Ltd., Hsinchu (TW)

(72) Inventors: Ting-Yu Yeh, Hsinchu (TW); Cing-He Chen, Taoyuan City (TW); Kuo-Chiang Ting, Hsinchu City (TW); Weiming Chris Chen, Taipei City (TW); Chia-Hao Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 897 days.

(21) Appl. No.: 17/857,162

(22) Filed: Jul. 4, 2022

(65) Prior Publication Data

US 2022/0336321 A1 Oct. 20, 2022

Related U.S. Application Data

(62) Division of application No. 16/524,172, filed on Jul. 29, 2019, now Pat. No. 11,728,238.

(51) Int. Cl.
*H10W 40/25* (2026.01)
*H10W 40/22* (2026.01)
(Continued)

(52) U.S. Cl.
CPC ......... *H10W 40/255* (2026.01); *H10W 40/22* (2026.01); *H10W 72/90* (2026.01); (Continued)

(58) Field of Classification Search
CPC . H01L 21/565; H01L 23/3107; H01L 23/367; H01L 24/09; H01L 2224/02372;
(Continued)

(56) References Cited

U.S. PATENT DOCUMENTS

2003/0058620 A1* 3/2003 Rumer ................ H01L 23/3675 361/705
2005/0004305 A1* 1/2005 Yamada .................. C08L 83/04 524/588

(Continued)

FOREIGN PATENT DOCUMENTS

CN 102244013 11/2011
CN 109216289 1/2019

(Continued)

OTHER PUBLICATIONS

Product Description, Thermal Interface Material X-23-7772-4, Shin-Etsu MicroSi, Inc., 2003. (Year: 2003).*

(Continued)

*Primary Examiner* — Davienne N Monbleau
*Assistant Examiner* — John Patrick Cornely
(74) *Attorney, Agent, or Firm* — JCIPRNET

(57) ABSTRACT

A manufacturing method of a semiconductor package includes the following steps. An encapsulated semiconductor package is provided on a substrate. A heat dissipation sheet is cut into a plurality of heat dissipation films. The plurality of heat dissipation films are attached on the encapsulated semiconductor package, wherein the plurality of heat dissipation films jointly cover an upper surface of the encapsulated semiconductor package. A cover lid is provided on the substrate, wherein the cover lid is in contact with the plurality of heat dissipation films.

20 Claims, 13 Drawing Sheets

(51) Int. Cl.

| | |
|---|---|
| ***H10W 72/90*** | (2026.01) |
| ***H10W 74/01*** | (2026.01) |
| ***H10W 74/10*** | (2026.01) |
| *H10W 70/65* | (2026.01) |

(52) U.S. Cl.

CPC ........ *H10W 74/016* (2026.01); *H10W 74/111* (2026.01); *H10W 70/65* (2026.01)

(58) Field of Classification Search

CPC ....... H01L 2924/3511; H01L 2224/131; H01L 2224/83855; H01L 23/053; H01L 23/562; H01L 24/16; H01L 24/32; H01L 24/92; H01L 2224/16235; H01L 2224/32245; H01L 2224/73253; H01L 2224/92225; H01L 2224/95; H01L 2224/96; H01L 21/486; H01L 23/3121; H01L 23/49816; H01L 23/3675; H01L 23/42; H01L 23/5384; H01L 23/3737; H01L 21/50; H01L 21/56; H01L 23/40; H01L 23/3735; H01L 23/433; H01L 23/4334; H01L 40/255; H01L 90/736; H01L 40/70; H10W 40/255; H10W 90/736; H10W 40/70

See application file for complete search history.

(56) References Cited

U.S. PATENT DOCUMENTS

| | | | | |
|---|---|---|---|---|
| 2005/0256241 | A1* | 11/2005 | Sachdev | H01L 23/433 257/E23.09 |
| 2014/0061893 | A1* | 3/2014 | Saeidi | H01L 23/562 438/122 |
| 2018/0175011 | A1* | 6/2018 | Sung | H01L 21/565 |

FOREIGN PATENT DOCUMENTS

| | | |
|---|---|---|
| JP | 2009293039 | 12/2009 |
| JP | 5128561 | 1/2013 |
| TW | 201411788 | 3/2014 |
| TW | 201913920 | 4/2019 |
| WO | 2015195295 | 12/2015 |

OTHER PUBLICATIONS

Technical Data Sheet, Dowsil(TM) SE 4450 Thermally Conductive Adhesive, The Dow Chemical Company, 2018. (Year: 2018).*

"Office Action of China Counterpart Application", issued on Aug. 27, 2024, p. 1-p. 11.

* cited by examiner

MANUFACTURING METHOD OF SEMICONDUCTOR PACKAGE INCLUDING CUTTING HEAT DISSIPATION SHEET INTO A PLURALITY OF HEAT DISSIPATION FILMS

CROSS-REFERENCE TO RELATED APPLICATION

This application is a divisional application of and claims the priority benefit of a prior application Ser. No. 16/524,172, filed on Jul. 29, 2019. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers and conductive layers over a semiconductor substrate, and patterning the various material layers using lithography to form circuit components and elements thereon.

In an attempt to further increase circuit density, three-dimensional (3D) ICs have been investigated. In a typical formation process of a 3D IC, two dies are bonded together and electrical connections are formed between each die and contact pads on a substrate. Interposer stacking is part of 3D IC technology, where a Through-Silicon-Via (TSV) embedded interposer is connected to a device silicon with a micro bump. 3D IC manufacturing process flows can be separated into two types. In a chip-on-wafer-on-substrate (CoWoS) process flow, a device silicon chip is first attached onto a silicon interposer wafer, which is then diced. The resulting stacked silicon is then attached onto a substrate.

However, some semiconductor packages tend to exhibit warpage, where warping of the substrate occurs during processing, such as during temperature stress. The warpage can cause reliability issues, such as a delamination of a film-type thermal interface material attached to the semiconductor device, and such delamination would result in great thermal resistance in the semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
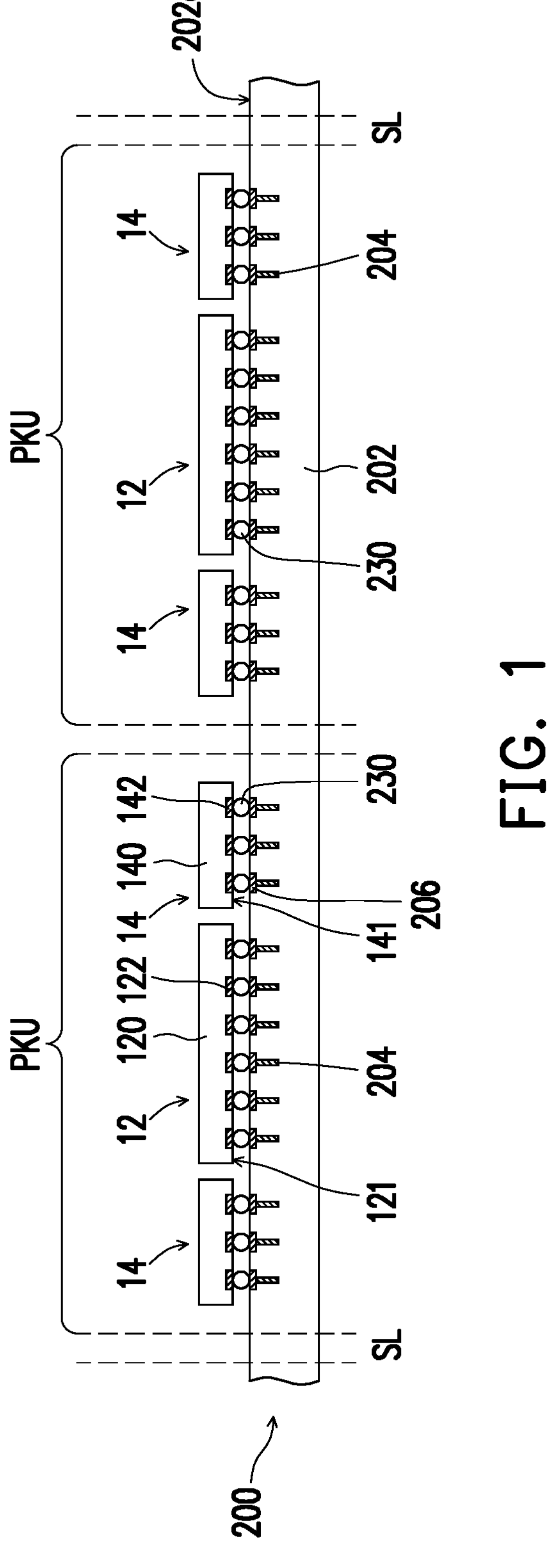
FIG. 1 to FIG. 9 illustrate cross sectional views of intermediate stages in a manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

For the embodiments provided herein, the technology may be discussed in a specific context, namely, cutting a heat dissipation sheet into a plurality of heat dissipation films and attaching the heat dissipation films onto an encapsulated semiconductor device. The semiconductor package may be warped during the heating process, and the heat dissipation films cut in common sizes improves the adhesion between the heat dissipation films and the encapsulated semiconductor device, which enhances heat dissipation efficiency by reducing the likelihood of delamination between the heat dissipation films and the encapsulated semiconductor device.

In accordance with some embodiments of the disclosure, manufacturing processes may include forming multi-chip package structures using Chip-on-Wafer-on-Substrate (CoWoS) packaging processing. Other embodiments may also using other processing, including integrated fan-out (InFO) packaging processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 to FIG. 9 illustrate cross sectional views of intermediate stages in a manufacturing of a semiconductor package according to some exemplary embodiments of the present disclosure. With now reference to FIG. 1, a redistribution structure 200 is provided. In some embodiments, the redistribution structure 200 may be an interposer, which includes a substrate 202, a plurality of through vias 204 and conductive pads 206 therein. In some embodiments, the substrate 202 may comprise a bulk semiconductor substrate, a silicon on insulator (SOI) substrate or a multi-layered semiconductor material substrate. The semiconductor material of the substrate 202 may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the substrate 202 may be doped or undoped. In some embodiments, the conductive pads 206 are formed on a first surface 202*a* of the interposer 200. In some embodiments, through vias 204 are formed in the substrate 202 and connected with the conductive pads 206. In some embodiments, the through vias 204 extend into the substrate 202 with a specific depth. In some embodiments, the through vias 204 are through-substrate vias. In some embodiments, the through vias 204 are through-silicon vias when the substrate 202 is a silicon substrate. In some embodiments, the through vias 204 may be formed by forming holes or recesses in the substrate 202 and then filling the recesses with a conductive material. In some embodiments, the recesses may be formed by, for example, etching, milling, laser drilling or the like. In some embodiments, the conductive material may be formed by an electro-chemical plating process, a chemical vapor deposition (CVD), an atomic layer deposition (ALD) or a physical vapor deposition (PVD), and the conductive material may include copper, tungsten, aluminum, silver, gold or a combination thereof.

In accordance with some embodiments of the disclosure, the conductive pads 206 connected with the through vias 204 may be formed as conductive parts of the redistribution layer(s) formed on the redistribution structure 200. In some embodiments, the conductive pads 206 include under bump metallurgies (UBMs). In certain embodiments, the interposer 200 may further include active or passive devices, such as transistors, capacitors, resistors, or diodes passive devices formed in the substrate 202.

In other embodiments, the redistribution structure 200 may be a redistribution circuit layers for an InFO package, and can be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the semiconductor device (e.g. semiconductor devices 12, 14) disposed thereon.

In FIG. 1, at least one semiconductor device is provided on the redistribution structure 200. In the present embodiment, a plurality of semiconductor devices 12, 14 are provided on the redistribution structure 200 in a side by side manner, but the disclosure is not limited thereto. In some embodiments, the semiconductor devices 12, 14 are individual dies singulated from a wafer. In some embodiments, the semiconductor devices 12 contain the same circuitry, such as devices and metallization patterns, or the semiconductor devices 12 are the same type of dies. In some embodiments, the semiconductor devices 14 contain the same circuitry, or the semiconductor devices 14 are the same type of dies. In certain embodiments, the semiconductor devices 12 and the semiconductor devices 14 may have different circuitry or are different types of dies. In alternative embodiments, the semiconductor devices 12 and the semiconductor devices 14 may have the same circuitry.

In accordance with some embodiments of the disclosure, the semiconductor devices 12 may be major dies, while the semiconductor devices 14 are tributary dies. Viewing from packaging units PKU defined between the scribe lanes (SL), the major dies may be arranged on the redistribution structure 200 in central locations of the packaging units PKU, while the tributary dies are arranged aside the major dies and spaced apart from the major dies. In some embodiments, the tributary dies are arranged around or surround the major dies. Certainly, the number and the layout design of the semiconductor devices 12, 14 are not limited thereto. In certain embodiments, the semiconductor devices 12 may have a surface area larger than that of the semiconductor devices 14. Moreover, in some embodiments, the semiconductor devices 12 and the semiconductor devices 14 may be of different sizes, including different surface areas and/or different thicknesses. In some embodiments, the semiconductor devices 12 may be logic dies, including a central processing unit (CPU) die, graphics processing unit (GPU) die, system-on-a-chip (SoC) die, a microcontroller or the like. In some embodiments, the semiconductor devices 12 may be power management dies, such as power management integrated circuit (PMIC) dies. In some embodiments, the semiconductor devices 14 may be memory dies, including dynamic random access memory (DRAM) dies, static random access memory (SRAM) dies or high bandwidth memory (HBM) dies. In some embodiments, the semiconductor device 12 include a body 120 and connecting pads 122 formed on an active surface 121 of the body 120. In certain embodiments, the connecting pads 122 may further include pillar structures for bonding the semiconductor device 12 to other structures. In some embodiments, the semiconductor device 14 include a body 140 and connecting pads 142 formed on an active surface 141 of the body 140. In other embodiments, the connecting pads 142 may further include pillar structures for bonding the semiconductor devices 14 to other structures.

In accordance with some embodiments of the disclosure, the semiconductor devices 12, 14 are attached to the first surface 202*a* of the redistribution structure 200, for example, through flip-chip bonding by way of the conductive joints 230. Through the reflow process, conductive joints 230 are formed between the connecting pads 122, 142 and conductive pads 206, electrically and physically connecting the semiconductor devices 12, 14 and the redistribution structure 200. In certain embodiments, the conductive joints 230 are micro-bumps, such as micro-bumps having copper metal pillars. In another embodiment, the conductive joints 230 are solder bumps, lead-free solder bumps, or micro bumps, such as controlled collapse chip connection (C4) bumps or micro bumps containing copper pillars. The conductive joints 230 electrically connect the semiconductor devices 12, 14 through the connecting pads 122, 142 and conductive pads 206, with the through vias 204 of the redistribution structure 200.

In accordance with some embodiments of the disclosure, the bonding between the semiconductor devices 12, 14 and the redistribution structure 200 may be solder bonding. In some embodiments, the bonding between the semiconductor devices 12, 14 and the redistribution structure 200 may be direct metal-to-metal bonding, such as copper-to-copper bonding. In some embodiments, an underfill material (not shown) may be dispensed into the gaps between the semiconductor devices 12, 14 and the redistribution structure 200 surrounding the conductive joints 230.

Figure 2:
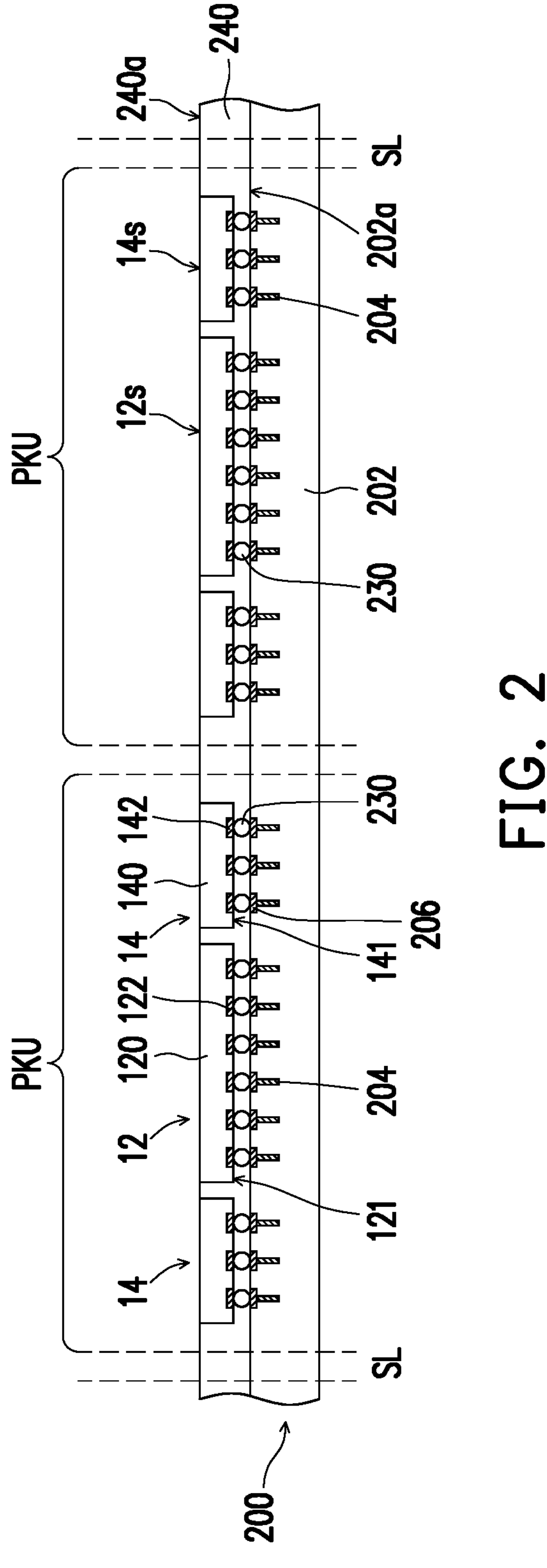

With now reference to FIG. 2, an encapsulating material 240 is formed over the redistribution structure 200 and covers the semiconductor devices 12, 14 and the conductive joints 230. In some embodiments, the encapsulating material 240 may be a molding compound. In some embodiments, the encapsulating material 240 includes epoxy resin(s) and may be formed by compression molding or transfer molding. In one embodiment, a curing process is performed to cure the encapsulating material 240. In some embodiments, the semiconductor devices 12, 14 and the conductive joints 230 are encapsulated by the encapsulating material 240. In some embodiments, a planarization process, including grinding or polishing, may be performed to partially remove the encapsulating material 240, exposing backside surfaces 12S, 14S of the first and second dies 12, 14. Accordingly, the upper surface (backside surfaces) 12S, 14S of the semiconductor devices 12, 14 are coplanar (levelled) with a top surface 240*a* of the encapsulating material 240.

Figure 3:
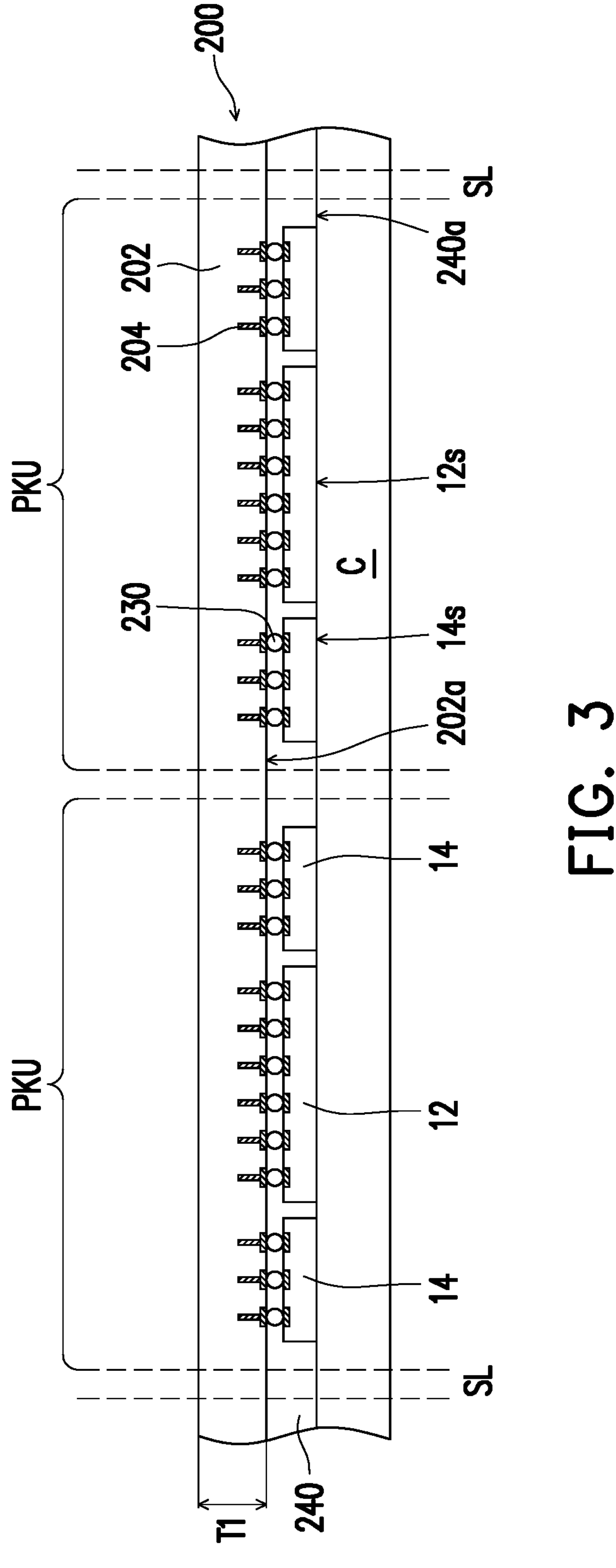

With now reference to FIG. 3, the structure of FIG. 2 is turned upside down or flipped, and placed on a carrier C, so that the carrier C directly contacts the backside surfaces 12S, 14S of the first and second dies 12, 14 and the top surface 240*a* of the encapsulating material 240. As shown in FIG. 3, at this stage of processing, the redistribution structure 200 has not been thinned and has a thickness T1.

Figure 4:
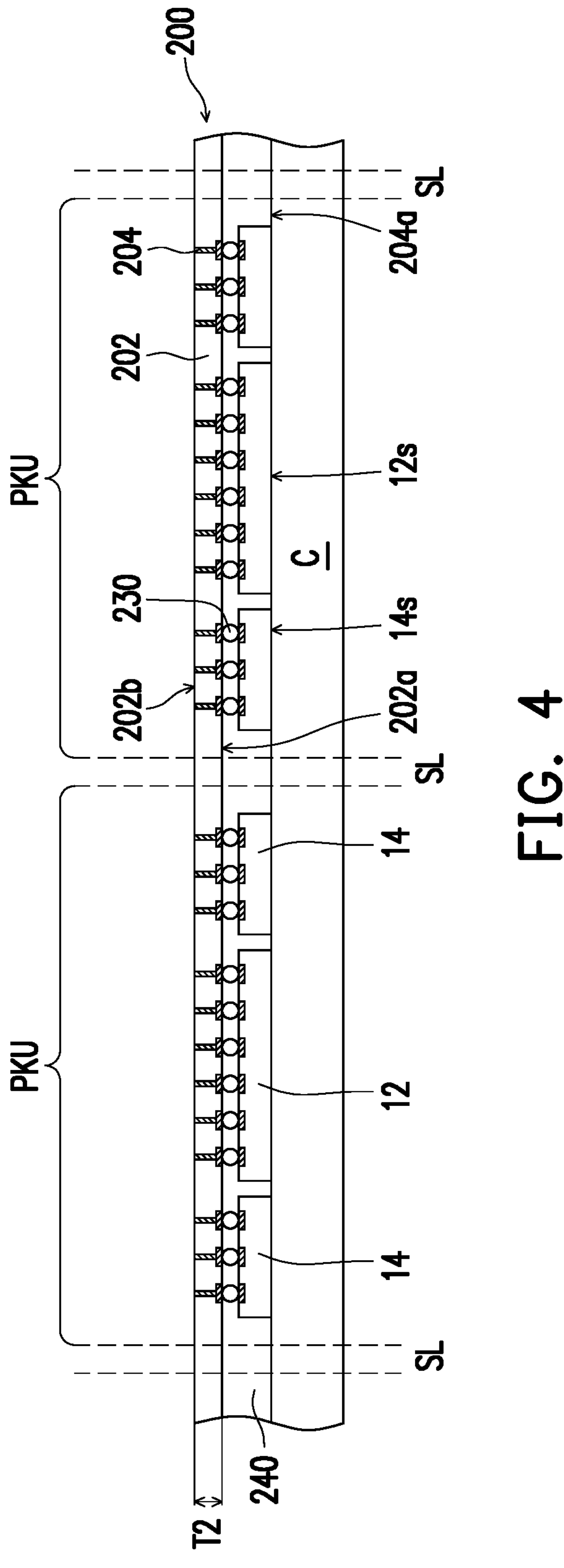

With now reference to FIG. 4, in an embodiment of the redistribution structure 200 being an interposer, a thinning process may be performed to the interposer 200 to partially remove or thin the substrate 202 of the interposer 200 until the through vias 204 are revealed and a second surface 202*b* of the interposer is formed. In some embodiments, the thinning process may include a back grinding process, a polishing process or an etching process. In some embodiments, after the thinning process, the interposer 200 is thinned to a thickness T2.

Figure 5:
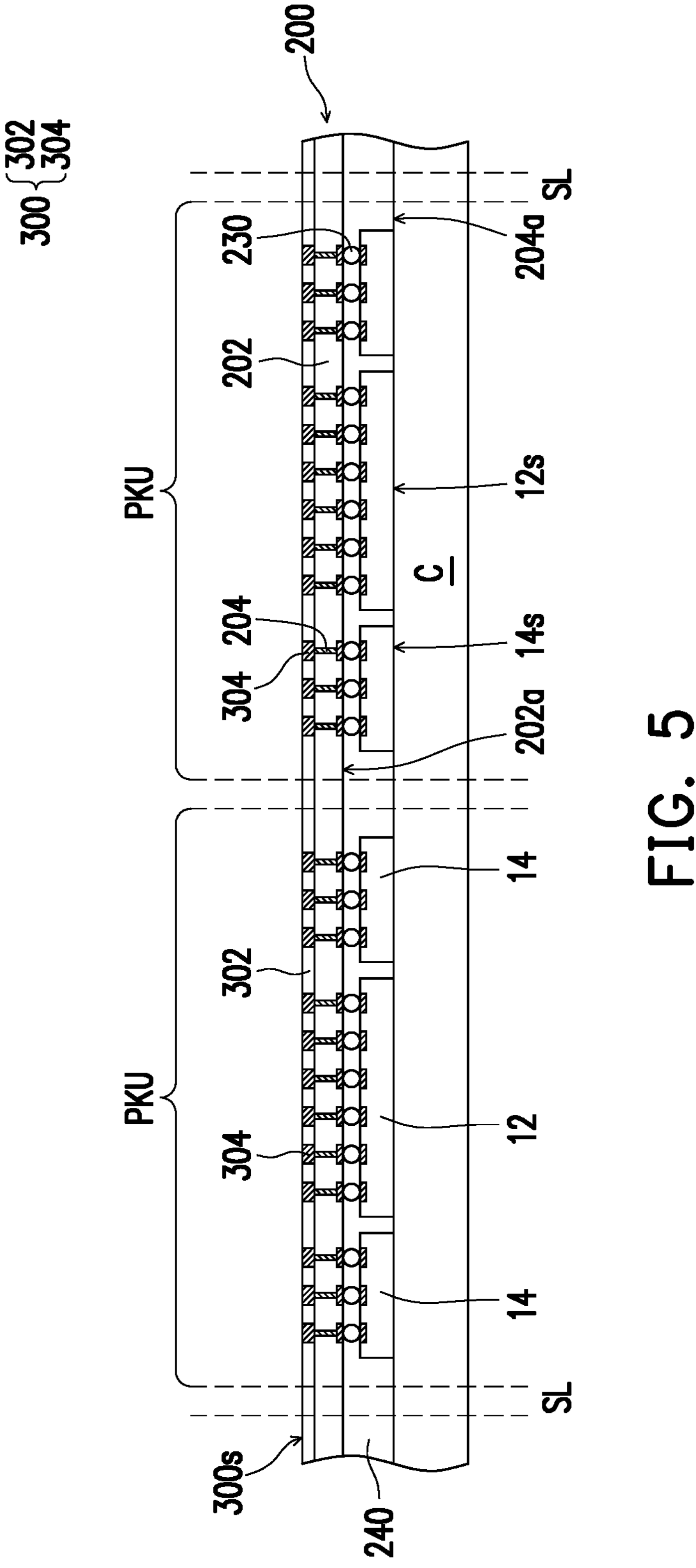

With now reference to FIG. 5, a redistribution layer 300 is formed on the second surface 202*b* of the substrate 202 (the interposer 200). In some embodiments, the redistribution layer 300 electrically connects the through vias 204 and/or electrically connects the through vias 204 with external devices. In certain embodiments, the redistribution layer 300 includes at least one dielectric layer 302 and metallization patterns 304 in the dielectric layer 302. In some embodiments, the metallization patterns 304 may comprise pads, vias and/or trace lines to interconnect the through vias 204 and to further connect the through vias 204 to one or more external devices. Although one layer of dielectric layer is shown in FIG. 5 and the following figures, more than one dielectric layer may be included within the redistribution structure. In some embodiments, the material of the dielectric layer 302 comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 302 may be formed by spin-coating or deposition, including chemical vapor deposition (CVD), PECVD, HDP-CVD, or the like. In some embodiments, the metallization patterns 304 include under-metal metallurgies (UBMs). In some embodiments, the formation of the metallization patterns 304 may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 304 includes copper, aluminum, tungsten, silver, and combinations thereof.

Figure 6:
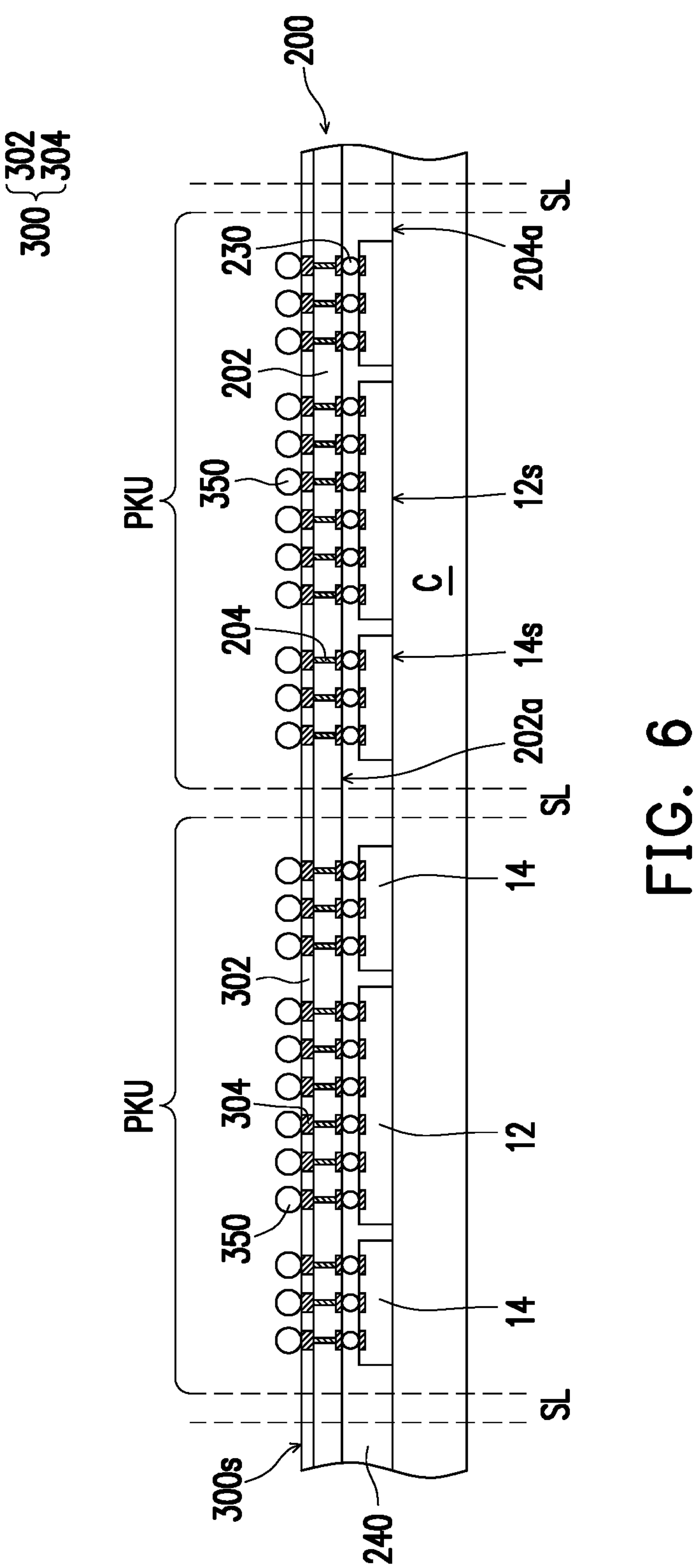

With now reference to FIG. 6, electrical connectors 350 are disposed on the metallization patterns 304 and are electrically coupled to the through vias 204. In some embodiments, the electrical connectors 350 are placed on the top surface 300*s* of the redistribution layer 300 and positioned on the metallization patterns 304. In some embodiments, the electrical connectors 350 include lead-free solder balls, solder balls, ball grid array (BGA) balls, bumps, C4 bumps or micro bumps. In some embodiments, the electrical connectors 350 may include a conductive material such as solder, copper, aluminum, gold, nickel, silver, palladium, tin, or a combination thereof. In some embodiments, the electrical connectors 350 are formed by forming the solder paste on the redistribution layer 300 by, for example, evaporation, electroplating, printing or solder transfer and then reflowed into the desired bump shapes. In some embodiments, the electrical connectors 350 are placed on the redistribution layer 300 by ball placement or the like. In other embodiments, the electrical connectors 350 are formed by forming solder-free metal pillars (such as a copper pillar) by sputtering, printing, electroless or electro plating or CVD, and then forming a lead-free cap layer by plating on the metal pillars.

In accordance with some embodiments of the disclosure, the electrical connectors 350 may be used to bond to an external device or an additional electrical component. In some embodiments, the electrical connectors 350 are used to bond to a substrate such as a circuit substrate, a semiconductor substrate or a packaging substrate, etc.

Figure 7:
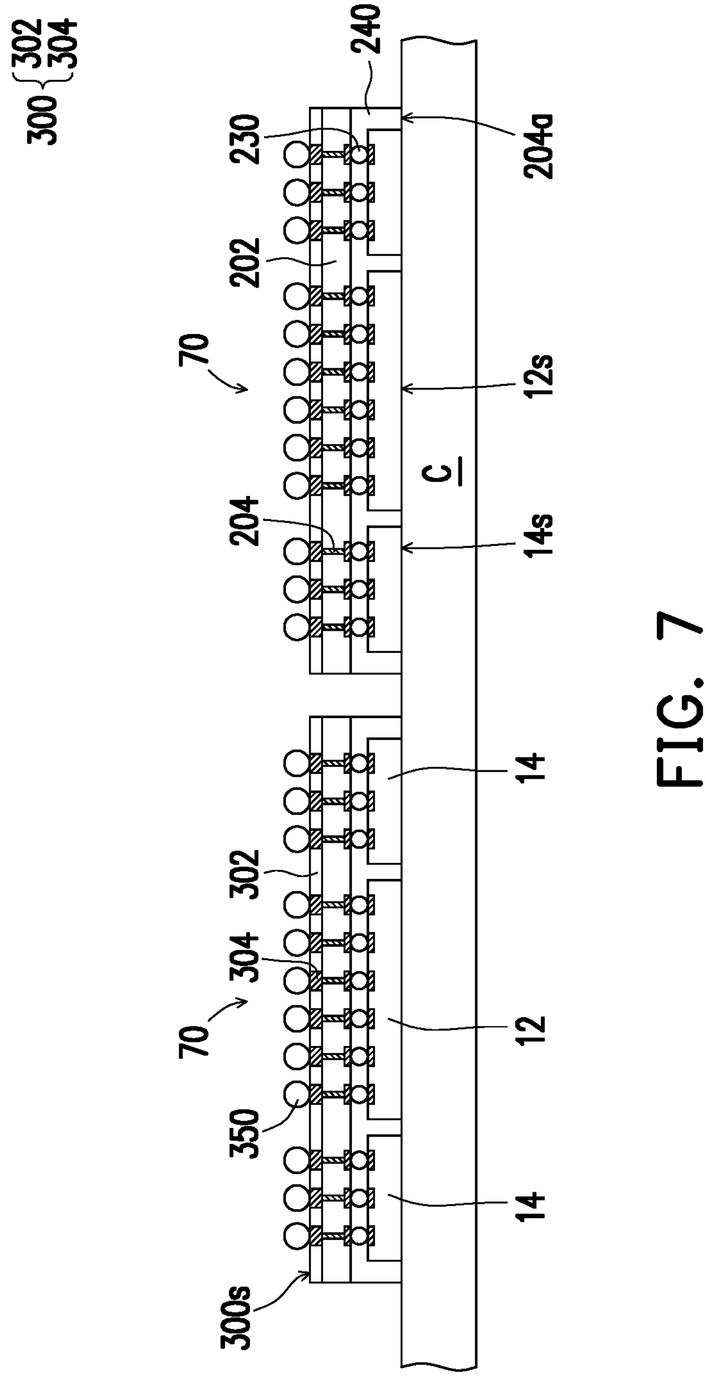

With now reference to FIG. 7, a singulation process is performed to cut the package structure of FIG. 6 along the scribe lanes SL around the package units PKU into a plurality of packages. Throughout the description, the packages including the semiconductor devices 12, 14, encapsulating material 240, redistribution structure 200 as shown in FIG. 7 is referred to as encapsulated semiconductor package 70. Accordingly, each of the encapsulated semiconductor packages 70 includes at least one semiconductor device 12/14, encapsulating material 240 surrounding the semiconductor device 12/14, redistribution structure 200 including through vias 204, the redistribution layer 300 including the dielectric layer 302 and the metallization patterns 304 and electrical connectors 350 disposed on the surface 300*s* of the redistribution layer 300. In some embodiments, the singulation process may include a sawing process or a dicing process.

After the singulation process, the encapsulated semiconductor packages 70 are detached from the carrier C and the carrier C is removed. In the subsequent process(es), the encapsulated semiconductor packages 70 may be flipped and further mounted on a substrate 80 such as a circuit substrate or a packaging substrate, etc.

Figure 8:
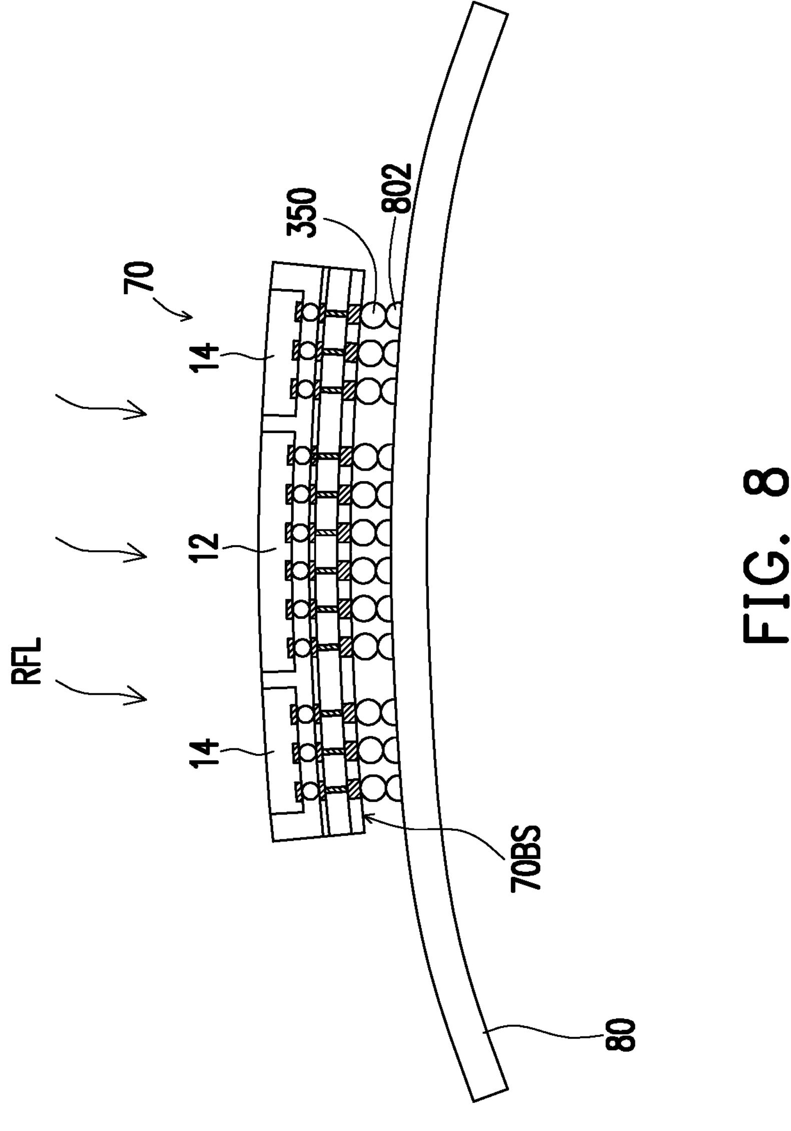

With now reference to FIG. 8, a substrate 80 having mounting portions 802 thereon is provided. In some embodiments, the substrate 80 may be placed on a substrate fixture (not shown) mounted on a platform. The substrate fixture may be a plate fixture having more than one fixture units. In some embodiments, the substrate 80 may include a build-up substrate, a laminate substrate, a circuit board such as a printed circuit board (PCB), or the like. In some embodiments, the mounting portion 802 may include pre-solder formed on pads of the substrate 80. In addition, the substrate 80 may further includes electrical contacts or other electric components therein.

Figure 13:
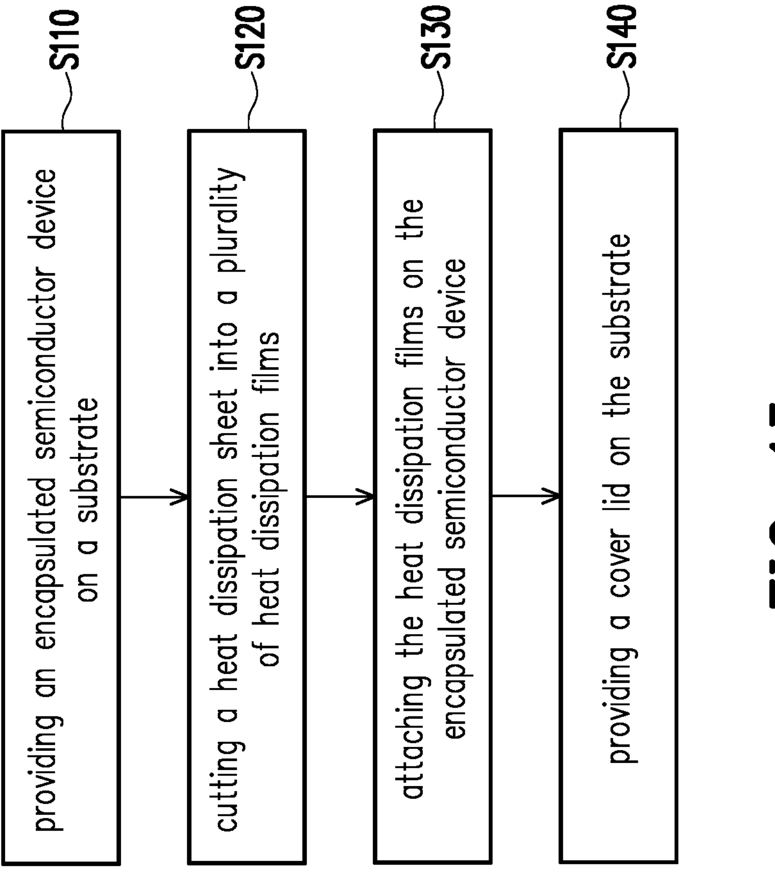
FIG. 13 illustrates a block diagram of a manufacturing process of a semiconductor package according to some exemplary embodiments of the present disclosure.

FIG. 13 illustrates a block diagram of a manufacturing process of a semiconductor package according to some exemplary embodiments of the present disclosure. With now reference to FIG. 8 and FIG. 13, performing the step S110, at least one encapsulated semiconductor package 70 is provided on the substrate 80. In some embodiments, the encapsulated semiconductor package 70 is provided with its bottom surface 70BS facing the substrate 80. In FIG. 8, although one encapsulated semiconductor package 70 and one substrate 80 are shown, multiple packages and multiple circuit substrates may be used. In some embodiments, the encapsulated semiconductor package 70 (and the semiconductor devices 12, 14) may be slightly warped before the reflow process, but the warpage degree of the encapsulated semiconductor package 70 before the reflow process may be smaller than the warpage degree of the encapsulated semiconductor package 70 when undergoing the reflow process.

In accordance with some embodiments of the disclosure, the encapsulated semiconductor package 70 is placed on the substrate 80 and then a reflow process RFL is performed. In some embodiments, the encapsulated semiconductor package 70 is picked and placed over a top surface of the substrate 80 and the electrical connectors 350 on the bottom surface 70BS of the package 70 are aligned to and disposed on the mounting portions 802 of the substrate 80. The reflow process is performed as part of the bonding process for the encapsulated semiconductor package 70 and the substrate 80 to bond the electrical connectors 350 to the mounting portions 802. In some embodiments, the reflow process includes performing a thermal heating process at a reflow temperature to electrical connectors 350 and the mounting portions 802, so that the electrical connectors 350 turns into a melted state or a semi-melted state to integrate and bond with the mounting portions 802 of the substrate 80. The reflow temperature of the electrical connectors 350 is required to be higher than a melting point of the electrical connectors 350. In one embodiment, the electrical connectors are C4 bumps, the reflow temperature ranges from 210° C. to 250° C. In one embodiment, the electrical connectors 350 are solder balls or lead-free solder balls, the reflow temperature ranges from 200° C. to 260° C.

In accordance with some embodiments of the disclosure, during the thermal process such as reflow process, under the thermal impact, the substrate 80, the semiconductor devices (and the semiconductor devices 12, 14) becomes warped owing to the CTE mismatch. In some embodiments, the geometric shape of the warped encapsulated semiconductor package 70 may correspond and conform to that of the warped substrate 80. In the present embodiment, the encapsulated semiconductor package 70 is bowed and becomes convex (crying-shape), but the disclosure is not limited thereto.

Figure 9:
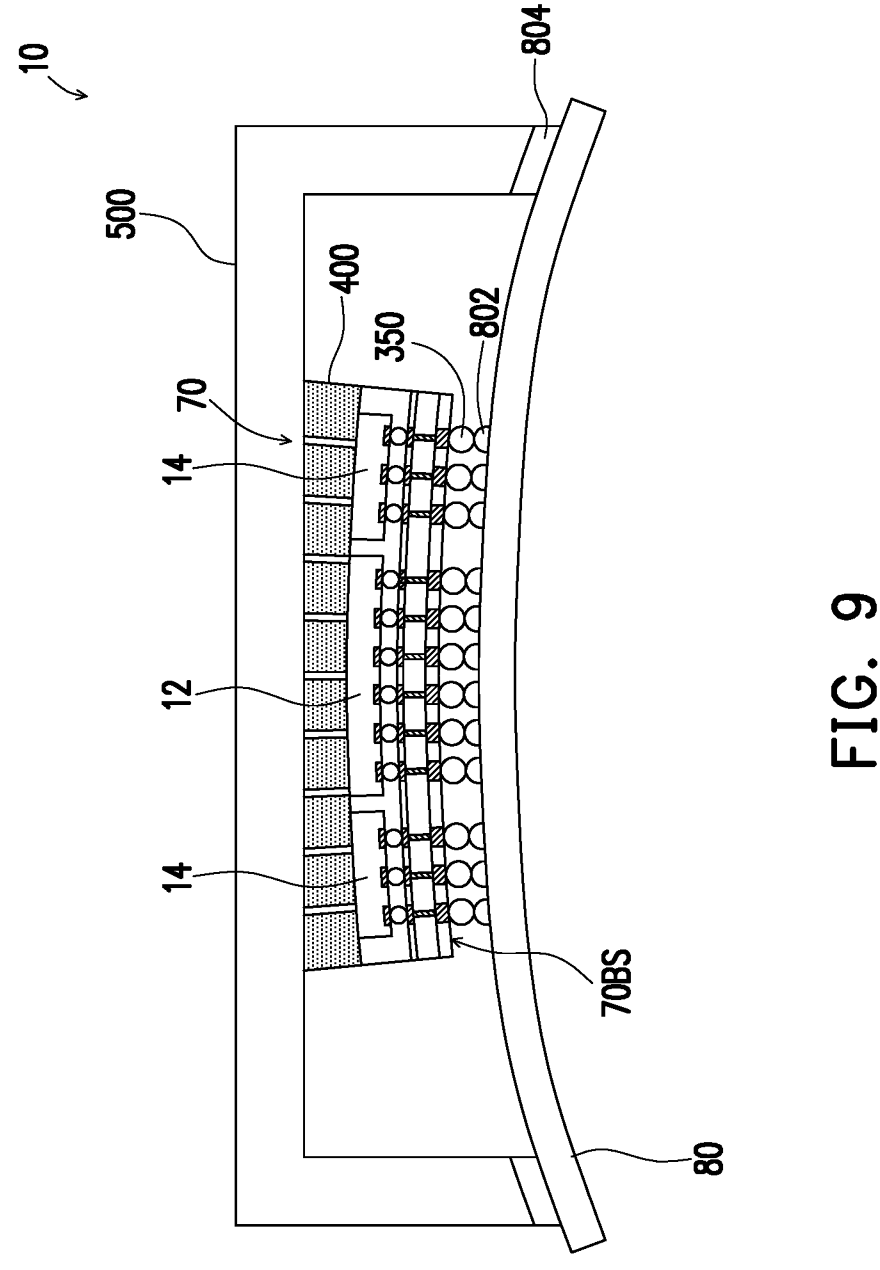

With now reference to FIG. 9 and FIG. 13, to reduce (correct) warpage of the encapsulated semiconductor package 70 and the substrate 80, a cover lid 500 illustrated in FIG. 9 may be provided on the substrate 80 and attached to the upper surface of encapsulated semiconductor package 70 by thermal interface material (TIM). In some embodiments, the thermal interface material may be a plurality of heat dissipation films 400, which is cut from a heat dissipation sheet (step S120). In some embodiments, The heat dissipation films 400 may include thermally conductive and electrically insulating material, such as an epoxy, like an epoxy mixed with a metal like silver or gold, a "thermal grease," a "white grease," the like, or a combination thereof. For example, the material of the heat dissipation films 400 may include an epoxy, silicone, an inorganic material such as a lightly cross-linked silicone polymer, one or more matrix polymers, a polymer with one or more thermally conductive fillers, other materials, or multiple layers or combinations thereof in some embodiments, as examples. In embodiments of the heat dissipation films 400 including a matrix polymer, the matrix polymer may include ethylene-propylene, an ethylene-propylene-diene monomer, hydrogenated polyisoprene, or a combination thereof. In embodiments of the heat dissipation films 400 including a thermally conductive filler, the thermally conductive filler may include aluminum oxide, boron nitride, aluminum nitride, aluminum, copper, silver, indium, or a combination thereof. The thermally conductive filler is dispersed within the heat dissipation films 400. Alternatively, the heat dissipation films 400 may include other materials, filler, and properties. The disclosure is not limited thereto.

In accordance with some embodiments of the disclosure, the material of the cover lid 500 may include steel and, in other embodiments, can be copper, stainless steel, the like, or a combination thereof. The heat dissipation films 400 may be attached to and jointly cover (attached to) the upper surface of the encapsulated semiconductor package 70 (step S130). In some embodiments, the heat dissipation films 400 are attached to upper surface of the encapsulated semiconductor package 70 using a pick and place tool. The cover lid 500 may then be placed, using a pick and place tool (may be the same as or similar to the pick and place tool used for the heat dissipation films 400), on the heat dissipation films 400 (step S140) to attach the cover lid 500 to the remainder of the encapsulated semiconductor package 70. In some embodiments, the cover lid 500 is in contact with the heat dissipation films 400. In some embodiments, the cover lid 500 may function as a heatsink, for example. In other embodiments, a heatsink (not shown) may further be disposed on the cover lid 500 for enhancing heat dissipation. In an alternative embodiment, the cover lid may include a plurality of upwardly extending fins disposed proximate a top surface thereof.

Figure 10:
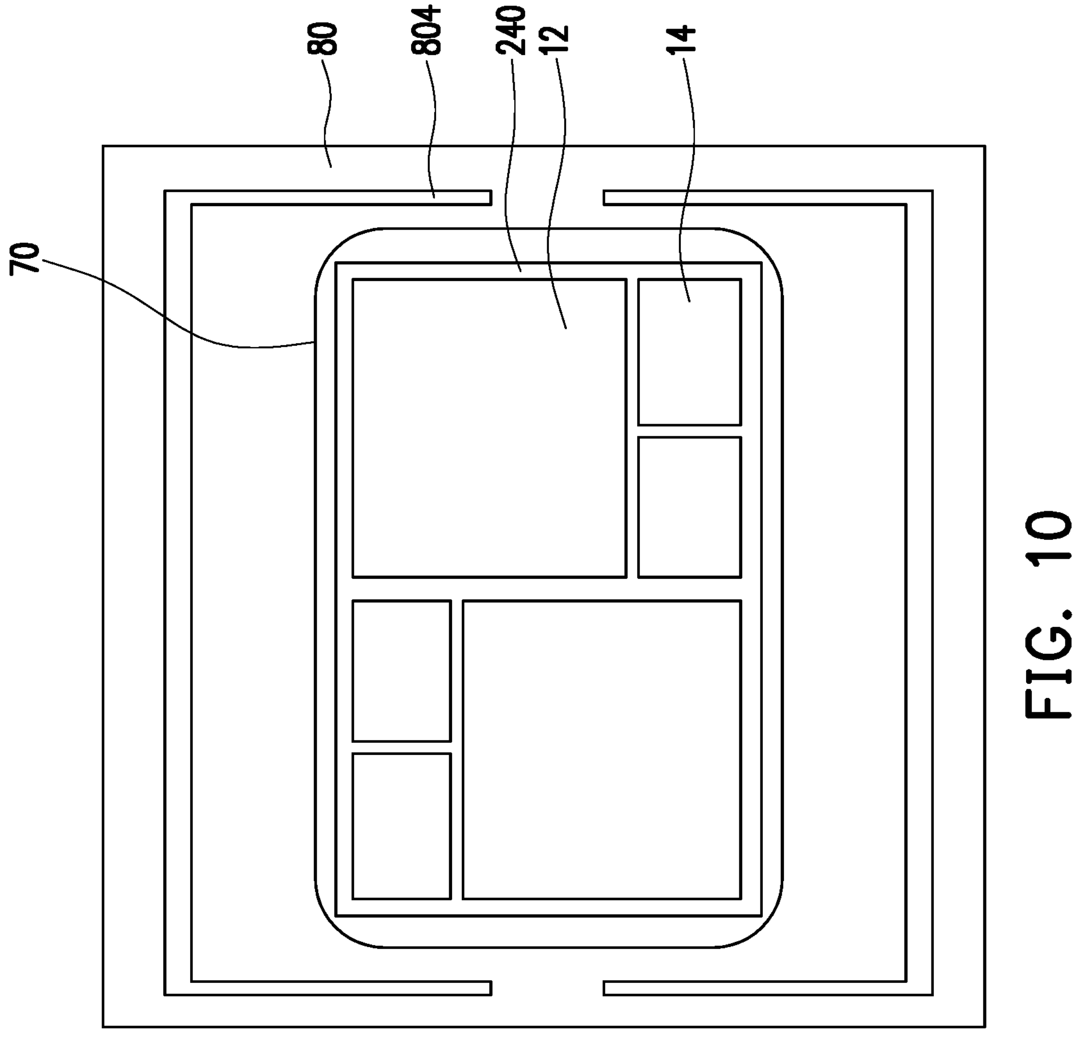
FIG. 10 illustrates a top view of intermediate stages in a manufacturing of a semiconductor package according to some exemplary embodiments of the present disclosure.
Figure 11:
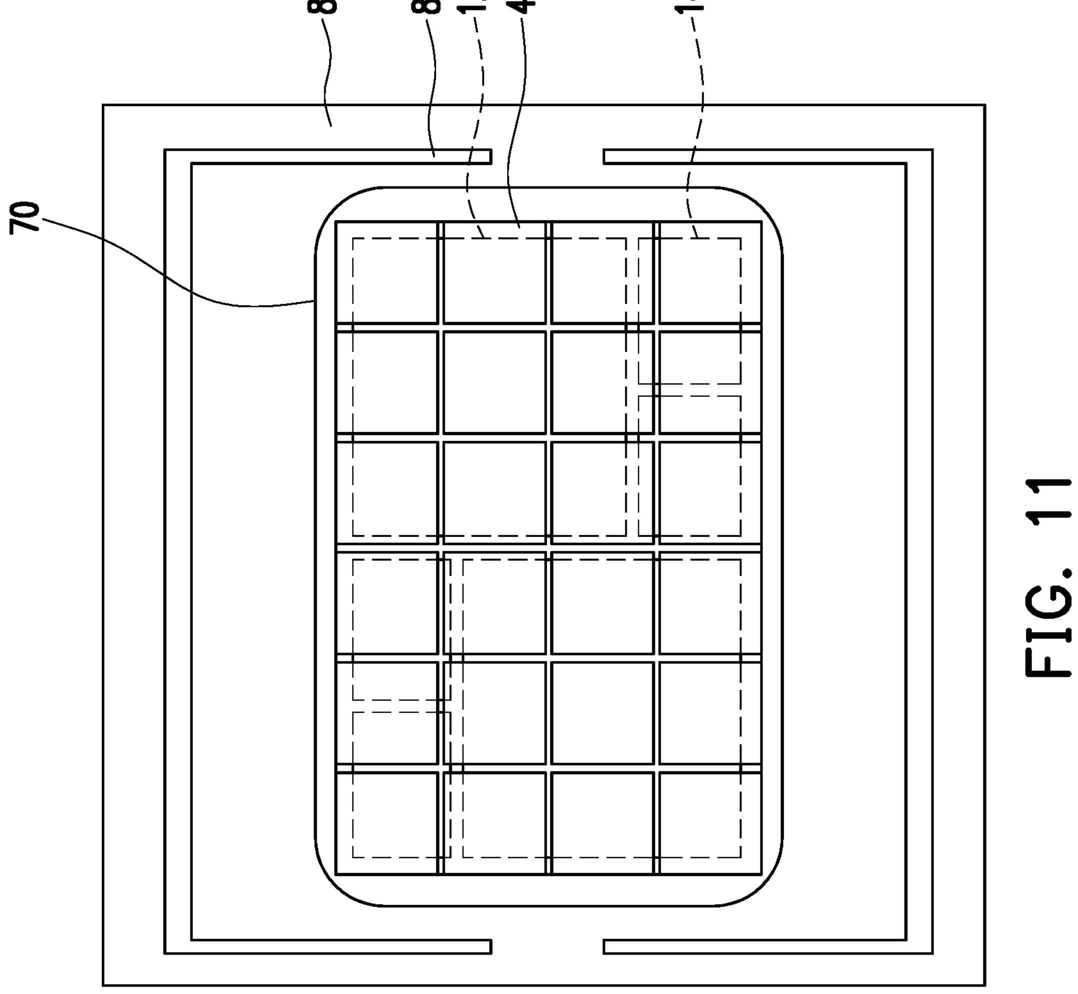
FIG. 11 illustrates a top view of intermediate stages in a manufacturing of a semiconductor package according to some exemplary embodiments of the present disclosure.

FIG. 10 illustrates a top view of intermediate stages in a manufacturing of a semiconductor package according to some exemplary embodiments of the present disclosure. FIG. 11 illustrates a top view of intermediate stages in a manufacturing of a semiconductor package according to some exemplary embodiments of the present disclosure. With now reference to FIG. 10 and FIG. 11, in some embodiments, a top view of an encapsulated semiconductor package 70 mounted on the substrate 80 before the heat dissipation films 400 is placed thereon is illustrated in FIG. 10. A top view of the structure after the heat dissipation films 400 is placed and before the cover lid 500 is placed thereon is illustrated in FIG. 11. It is noted that the layout design of the encapsulated semiconductor package 70 (semiconductor devices 12, 14) in FIG. 10 may be slightly different from that of the encapsulated semiconductor package 70 (semiconductor devices 12, 14) illustrated in FIG. 8. However, the encapsulated semiconductor package 70 illustrated in FIG. 10 may be formed by the same or at least similar manufacturing process described in FIG. 1 to FIG. 8. In some embodiments, an adhesive 804 may be dispensed on a peripheral region of the substrate 80 where the cover lid (e.g. the cover lid 500 illustrated in FIG. 9) will be attached for attaching the cover lid to the substrate 80. Pressure may be applied when installing the cover lid, and the adhesive 804 is cured. The adhesive 804 may include a high transition temperature adhesive in some embodiments. Alternatively, other types of adhesives 804 may be used.

In accordance with some embodiments of the disclosure, a heat dissipation sheet is cut into a plurality of heat dissipation films 400 in common sizes as shown in FIG. 11. In some embodiments, sizes of the heat dissipation films 400 may be the same. However, in other embodiments, the sizes of the heat dissipation films 400 may be different from one another according to actual needs and layout design of the semiconductor devices 12. 14. In some embodiments, the heat dissipation films 400 are disposed on the encapsulated semiconductor package 70 in a side by side manner. To be more specific, the heat dissipation films 400 may be disposed on the upper surfaces (backside surfaces) of the semiconductor devices 12, 14 in a side by side manner and jointly cover (in contact with) the upper surfaces of the semiconductor devices 12, 14 as it is shown in FIG. 11. In some embodiments, the heat dissipation films 400 may also cover the encapsulating material 240. That is, at least one of the heat dissipation films 400 may be disposed on the top surface of the encapsulating material 240.

In some embodiments, the sizes of the heat dissipation films 400 may not be correspond and conform to the sizes of the semiconductor devices 12, 14. In other words, an edge of each of the heat dissipation films 400 may not be aligned with an edge of each of the semiconductor devices 12, 14 from a top view. For the embodiments of the semiconductor package having one semiconductor device 12 or 14, the heat dissipation films 400 may jointly cover that one semiconductor device 12 or 14. For the embodiments of the semiconductor package having a plurality of semiconductor devices 12 and 14, two of the heat dissipation films 400 adjacent to each other may jointly cover one of the semiconductor devices 12/14.

With such arrangement, the heat dissipation films 400 are cut into smaller pieces to be attached to the encapsulated semiconductor package 70. Accordingly, the heat dissipation films 400 in small pieces can easily correspond to the shape of the encapsulated semiconductor package 70 or the outline of the semiconductor devices 12, 14 without having to customize a heat dissipation sheet for each product. Therefore, the arrangement of the heat dissipation films 400 improves productivity and process flexibility of the semiconductor package 10.

Moreover, the heat dissipation films 400 in small pieces can easily correspond to the curvature (warpage) of the upper surface of the encapsulated semiconductor package 70. Accordingly, the delamination of the heat dissipation films 400 at highly warped regions of the encapsulated semiconductor package 70 can be avoided or at least reduced. The delamination would lead to great thermal resistance in the semiconductor package 10. Therefore, the arrangement of the heat dissipation films 400 improves yield and heat dissipation efficiency of the semiconductor package 10.

Figure 12:
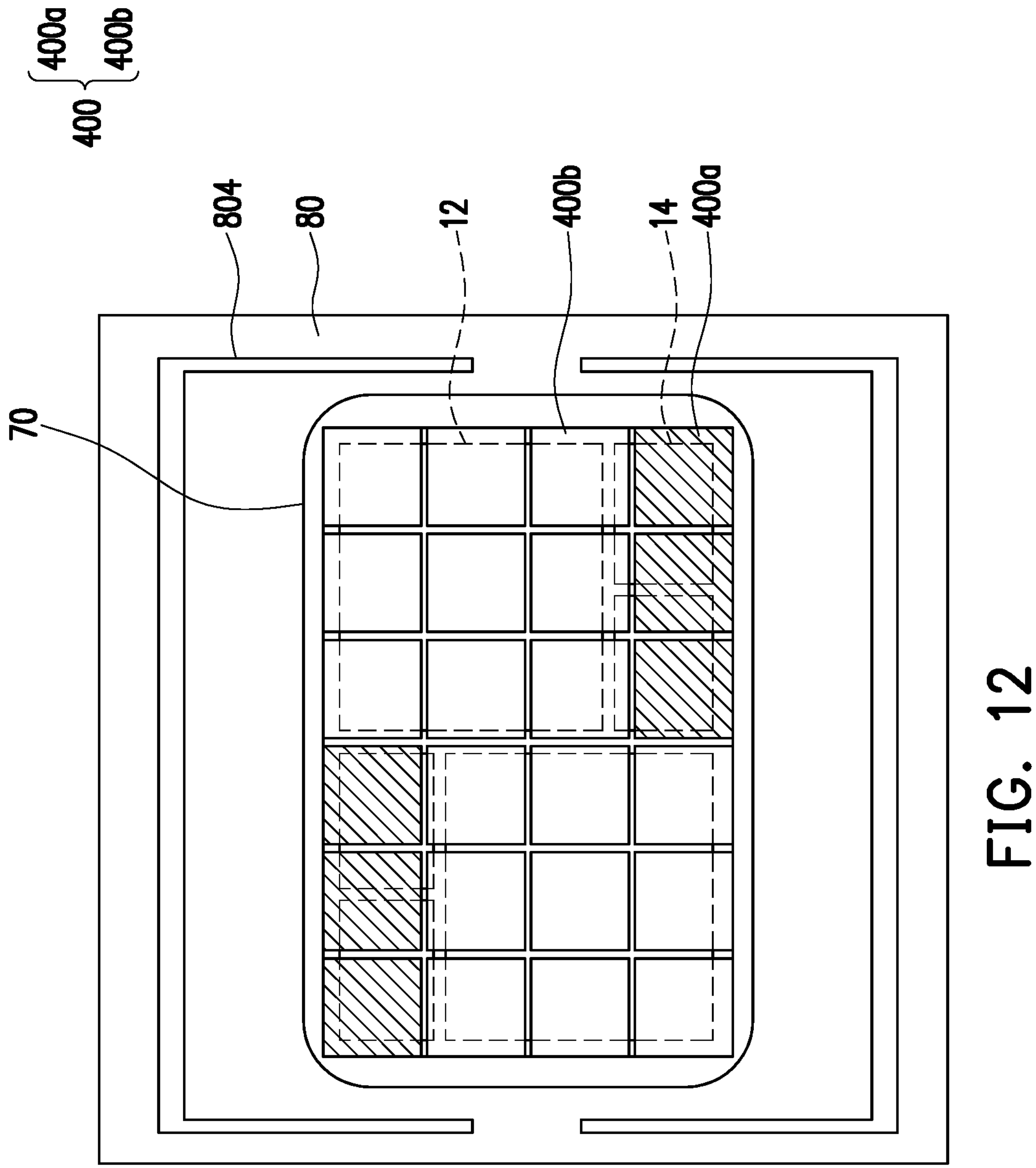
FIG. 12 illustrates a top view of intermediate stages in a manufacturing of a semiconductor package according to some exemplary embodiments of the present disclosure.

FIG. 12 illustrates a top view of intermediate stages in a manufacturing of a semiconductor package according to some exemplary embodiments of the present disclosure. It is noted that the semiconductor package shown in FIG. 12 contains many features same as or similar to the semiconductor package disclosed earlier with FIG. 9 to FIG. 11. For purpose of clarity and simplicity, detail description of same or similar features may be omitted, and the same or similar reference numbers denote the same or like components. The main differences between the semiconductor package shown in FIG. 12 and the semiconductor package shown in FIG. 9 to FIG. 11 are described as follows.

With now reference to FIG. 9 and FIG. 12, the heat dissipation films 400 includes at least one first heat dissipation film 400*a* and at least one second heat dissipation film 400*b*. In some embodiments, a thickness and/or a viscosity of the first heat dissipation film 400*a* is different from a thickness and/or a viscosity of the second heat dissipation film 400*b*. In some embodiments, the thickness of the first heat dissipation film 400*a* may be substantially greater than the thickness of the second heat dissipation film 400*b*. With such arrangement, the first heat dissipation film 400*a* may be attached to a highly warped region (e.g. a peripheral region) of the encapsulated semiconductor package 70, and the second heat dissipation film 400*b* may be attached to a lower warped region (e.g. a central region) of the encapsulated semiconductor package 70. That is to say, a region of the encapsulated semiconductor package 70 where the first heat dissipation film 400*a* is attached has a warpage higher than another region of the encapsulated semiconductor package 70 where the second heat dissipation film 400*b* is attached. Thereby, when the first heat dissipation film 400*a* and the second heat dissipation film 400*b* are attached to the warped encapsulated semiconductor package 70, the cover lid 500 can still be in solid contact with the first heat dissipation film 400*a* and the second heat dissipation film 400*b*.

In accordance with some embodiments of the disclosure, the viscosity of the first heat dissipation film 400*a* may be substantially greater than the viscosity of the second heat dissipation film 400*b*. With such arrangement, the first heat dissipation film 400*a* may be attached to a highly warped region (e.g. a peripheral region) of the encapsulated semiconductor package 70, and the second heat dissipation film 400*b* may be attached to a lower warped region (e.g. a central region) of the encapsulated semiconductor package 70. Thereby, the delamination of the heat dissipation films 400*a* at highly warped regions of the encapsulated semiconductor package 70 can be avoided or at least reduced. In some embodiments, the thickness and the viscosity of the first heat dissipation film 400*a* may both be greater than thickness and the viscosity of the second heat dissipation film 400*b*. Thereby, the delamination of the heat dissipation films 400*a* at highly warped regions of the encapsulated semiconductor package 70 can be avoided or reduced, and the cover lid 500 can be in solid contact with the first heat dissipation film 400*a* and the second heat dissipation film 400*b*, so as to improve the heat dissipation of the semiconductor package.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a redistribution structure, at least one semiconductor device and a plurality of heat dissipation films. The at least one semiconductor device is mounted on the redistribution structure. The plurality of heat dissipation films are disposed on the at least one semiconductor device in a side by side manner and jointly cover an upper surface of the at least one semiconductor device.

In accordance with some embodiments of the disclosure, a semiconductor package includes a substrate, an encapsulated semiconductor package, a plurality of heat dissipation films and a cover lid. The encapsulated semiconductor package is disposed on the substrate. The plurality of heat dissipation films are disposed on the encapsulated semiconductor package in a side by side manner and cover an upper surface of the encapsulated semiconductor package. The cover lid is disposed on the substrate and in contact with the plurality of heat dissipation films.

In accordance with some embodiments of the disclosure, a manufacturing method of a semiconductor package includes the following steps. An encapsulated semiconductor package is provided on a substrate. A heat dissipation sheet is cut into a plurality of heat dissipation films. The plurality of heat dissipation films are attached on the encapsulated semiconductor package, wherein the plurality of heat dissipation films jointly cover an upper surface of the encapsulated semiconductor package. A cover lid is provided on the substrate, wherein the cover lid is in contact with the plurality of heat dissipation films.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:

providing an encapsulated semiconductor package on a substrate;

cutting a heat dissipation sheet into a plurality of heat dissipation films;

attaching the plurality of heat dissipation films on the encapsulated semiconductor package, wherein the plurality of heat dissipation films are arranged in an array manner with a gap between adjacent two of the plurality of heat dissipation films and jointly cover an upper surface of the encapsulated semiconductor package; and providing a cover lid on the substrate, wherein the cover lid is in contact with the plurality of heat dissipation films.

2. The manufacturing method of the semiconductor package as claimed in claim 1, wherein providing the encapsulated semiconductor package on the substrate further comprises:

mounting the encapsulated semiconductor package on the substrate through a plurality of electrical connectors.

3. The manufacturing method of the semiconductor package as claimed in claim 1, wherein providing the encapsulated semiconductor package on the substrate further comprises:

providing at least one semiconductor device on a redistribution structure;

providing an encapsulating material on the redistribution structure, wherein the encapsulating material encapsulates the at least one semiconductor device.

4. The manufacturing method of the semiconductor package as claimed in claim 3, wherein providing the encapsulated semiconductor package on the substrate further comprises:

performing a planarization process on the encapsulating material, such that a top surface of the encapsulating material is coplanar with a top surface of the at least one semiconductor device, wherein the plurality of heat dissipation films are in contact with the top surface of the at least one semiconductor device.

5. The manufacturing method of the semiconductor package as claimed in claim 3, wherein the at least one semiconductor device comprises a plurality of semiconductor devices arranged in a side by side manner and two of the plurality of the heat dissipation films jointly cover one of the plurality of the semiconductor devices.

6. The manufacturing method of the semiconductor package as claimed in claim 1, wherein sizes of the plurality of heat dissipation films, from a top view, are the same.

7. The manufacturing method of the semiconductor package as claimed in claim 1, wherein attaching the plurality of heat dissipation films on the encapsulated semiconductor package further comprises:

attaching at least one first heat dissipation film on a first portion of the encapsulated semiconductor package; and attaching at least one second heat dissipation film on a second portion of the encapsulated semiconductor package.

8. The manufacturing method of the semiconductor package as claimed in claim 7, wherein the at least one first heat dissipation film and the at least one second heat dissipation film are disposed in a side-by-side manner.

9. The manufacturing method of the semiconductor package as claimed in claim 7, wherein a thickness of the at least one first heat dissipation film is different from that of the at least one second heat dissipation film.

10. The manufacturing method of the semiconductor package as claimed in claim 7, wherein a viscosity of the at least one first heat dissipation film is different from that of the at least one second heat dissipation film.

11. A manufacturing method of a semiconductor package, comprising:

providing a semiconductor package on a substrate;

cutting a heat dissipation sheet into a plurality of heat dissipation films;

attaching the plurality of heat dissipation films on the semiconductor package, wherein each of the heat dissipation films comprises thermally conductive material mixed with electrically insulating material, and the plurality of heat dissipation films are arranged in an array manner with a gap between adjacent two of the plurality of heat dissipation films and jointly cover an upper surface of the encapsulated semiconductor package; and providing a cover lid on the substrate, wherein the cover lid is in contact with the plurality of heat dissipation films.

12. The manufacturing method of the semiconductor package as claimed in claim 11, wherein providing the semiconductor package on the substrate further comprises:

providing at least one semiconductor device on an interposer; and providing an encapsulating material on the interposer, wherein the encapsulating material encapsulates the at least one semiconductor device.

13. The manufacturing method of the semiconductor package as claimed in claim 12, wherein providing the encapsulated semiconductor package on the substrate further comprises:

performing a planarization process on the encapsulating material, such that a top surface of the encapsulating material is coplanar with a top surface of the at least one semiconductor device.

14. The manufacturing method of the semiconductor package as claimed in claim 12, wherein the plurality of heat dissipation films are in contact with the top surface of the encapsulating material and the top surface of the at least one semiconductor device.

15. The manufacturing method of the semiconductor package as claimed in claim 11, a profile of one of the plurality of heat dissipation films from a top view is aligned with a profile of a contact surface of the one of the plurality of heat dissipation films for contacting the semiconductor package.

16. A manufacturing method of a semiconductor package, comprising:

Providing an encapsulated semiconductor package on a substrate;

cutting a heat dissipation sheet into a plurality of heat dissipation films, wherein sizes of the plurality of heat dissipation films, from a top view, are the same;

attaching the plurality of heat dissipation films on the encapsulated semiconductor package, wherein the plurality of heat dissipation films are arranged in an array manner with a gap between adjacent two of the plurality of heat dissipation films and jointly cover an upper surface of the encapsulated semiconductor package; and attaching a cover lid on the substrate and in contact with the plurality of heat dissipation films.

17. The manufacturing method of the semiconductor package as claimed in claim 16, wherein the plurality of heat dissipation films are attached to the upper surface of the semiconductor package using a pick and place tool.

18. The manufacturing method of the semiconductor package as claimed in claim 16, wherein cutting the heat dissipation sheet into the plurality of heat dissipation films comprises:

cutting a first heat dissipation sheet into a plurality of first heat dissipation films; and cutting a second heat dissipation sheet into a plurality of second heat dissipation films.

19. The manufacturing method of the semiconductor package as claimed in claim 18, wherein attaching the plurality of heat dissipation films on the semiconductor package further comprises:

attaching the plurality of first heat dissipation films on a first portion of the semiconductor package; and attaching the plurality of second heat dissipation films on a second portion of the semiconductor package, wherein a thickness or a viscosity of each of the plurality of first heat dissipation films is different from that of each of the plurality of second heat dissipation films.

20. The manufacturing method of the semiconductor package as claimed in claim 19, wherein the first portion is a peripheral portion of the semiconductor package and the second portion is a central portion of the semiconductor package surrounded by the first portion.

* * * * *